(12) United States Patent
Yamamoto

(10) Patent No.: US 11,217,829 B2
(45) Date of Patent: Jan. 4, 2022

(54) BATTERY PACK

(71) Applicant: DENSO CORPORATION, Kariya (JP)

(72) Inventor: Kohei Yamamoto, Kariya (JP)

(73) Assignee: DENSO CORPORATION, Kariya (JP)

(*) Notice: Subject to any disclaimer, the term of this patent is extended or adjusted under 35 U.S.C. 154(b) by 130 days.

(21) Appl. No.: 16/126,224

(22) Filed: Sep. 10, 2018

(65) Prior Publication Data

US 2019/0081365 A1 Mar. 14, 2019

(30) Foreign Application Priority Data

Sep. 12, 2017 (JP) .............................. JP2017-175065

(51) Int. Cl.
| | | |
|---|---|---|
| H01M 10/00 | (2006.01) | |
| H01M 10/42 | (2006.01) | |
| H05K 1/18 | (2006.01) | |
| H05K 7/14 | (2006.01) | |
| H05K 7/20 | (2006.01) | |
| H01M 50/20 | (2021.01) | |
| B60R 16/033 | (2006.01) | |

(52) U.S. Cl.
CPC ......... H01M 10/425 (2013.01); H01M 50/20 (2021.01); H05K 1/18 (2013.01); H05K 7/1427 (2013.01); H05K 7/209 (2013.01); H05K 7/20854 (2013.01); B60R 16/033 (2013.01); H01M 2010/4271 (2013.01); H01M 2220/20 (2013.01); H05K 2201/10037 (2013.01); H05K 2201/10053 (2013.01)

(58) Field of Classification Search
CPC .............................. H01M 10/425; H05K 1/18
See application file for complete search history.

(56) References Cited

U.S. PATENT DOCUMENTS

| | | | | |
|---|---|---|---|---|
| 3,391,242 | A | * 7/1968 | Sudges ................... | H01L 23/42 174/16.3 |
| 2005/0243509 | A1 | * 11/2005 | Fuseya ..................... | G06F 1/20 361/679.47 |
| 2006/0164812 | A1 | * 7/2006 | Ha ....................... | H01M 50/209 361/709 |
| 2014/0011058 | A1 | 1/2014 | Adachi et al. | |
| 2016/0257270 | A1 | * 9/2016 | Teramoto ................ | B60L 58/20 |

FOREIGN PATENT DOCUMENTS

| | | | |
|---|---|---|---|
| EP | 2290728 A1 * | 3/2011 | ........ H01M 10/6555 |
| JP | 2014-013724 A | 1/2014 | |
| JP | 6001360 B2 | 10/2016 | |
| JP | 2018-063922 A | 4/2018 | |
| JP | 2018-067533 A | 4/2018 | |
| JP | 2018-098935 A | 6/2018 | |

* cited by examiner

*Primary Examiner* — Milton I Cano
*Assistant Examiner* — Mary G Henshaw
(74) *Attorney, Agent, or Firm* — Oliff PLC

(57) ABSTRACT

A battery pack is provided which includes a battery, a circuit board equipped with load feed lines, bus bars connecting with the battery and the circuit board, first and second switches, and third to sixth switches. The first and second switches are disposed in a housing which is higher in capacity of heat dissipation than the circuit board. The third to sixth switches are disposed on the circuit board. The first and second switches are larger in amount of electrical current flowing therethrough than the third to sixth switches on time average. This enables the size of the battery pack to be reduced without sacrificing the dissipation of heat from the switches.

8 Claims, 7 Drawing Sheets

FIG.3

| | 1st S.W. | 2nd S.W. | 3rd S.W. | 4th S.W. | 5th S.W. | 6th S.W. |
|---|---|---|---|---|---|---|
| Pb STARTING CONTROL MODE | OFF | OFF | ON | OFF | OFF | OFF |
| IDLE-STOP CONTROL MODE | ON | OFF | OFF | ON | OFF | OFF |
| Li RESTART CONTROL MODE | OFF | ON | OFF | ON | OFF | OFF |
| Pb RESTART CONTROL MODE | ON | OFF | OFF | ON | OFF | OFF |
| Li CRUISE CONTROL MODE | OFF | ON | OFF | OFF | OFF | OFF |
| 1st POWER GENERATION MODE | ON | ON | ON | ON | OFF | OFF |
| 2nd POWER GENERATION MODE | ON | OFF | OFF | OFF | OFF | OFF |
| PARKING/STOP CONTROL MODE | OFF | OFF | OFF | OFF | ON | ON |

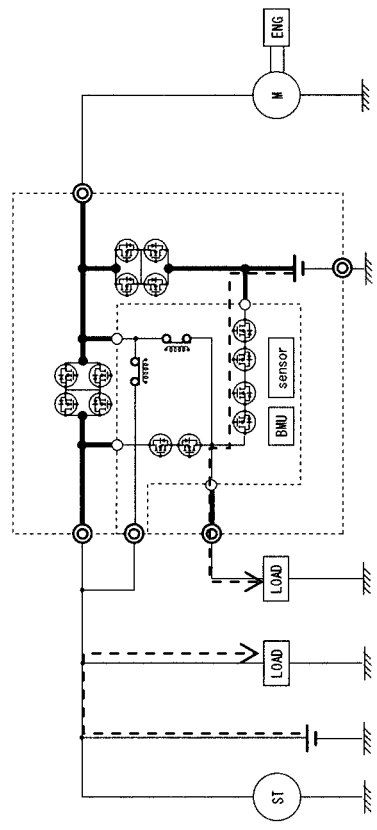
FIG.4(b) IDLE-STOP CONTROL MODE
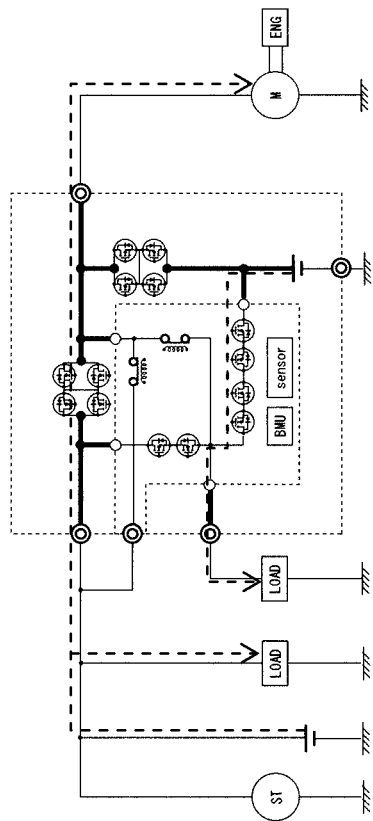
FIG.4(d) Pb RESTART CONTROL MODE
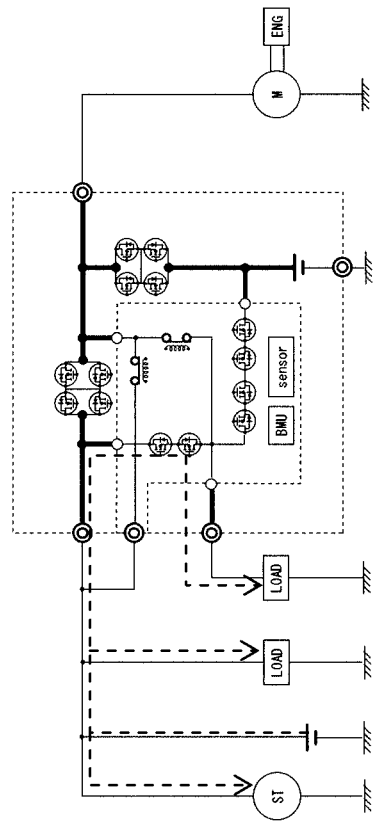
FIG.4(a) Pb STARTING CONTROL MODE
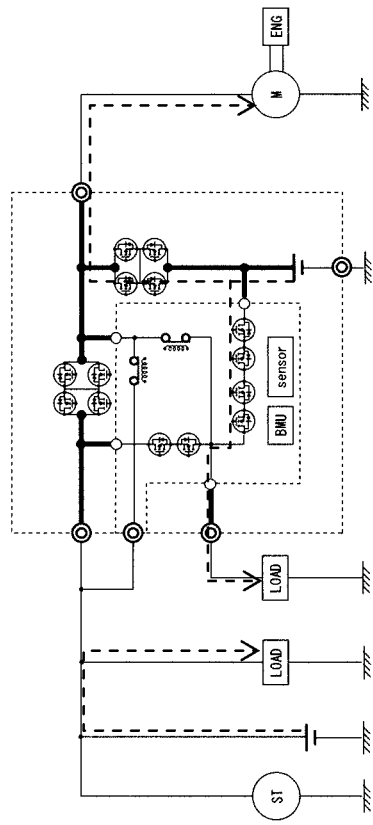
FIG.4(c) Li RESTART COTNROL MODE

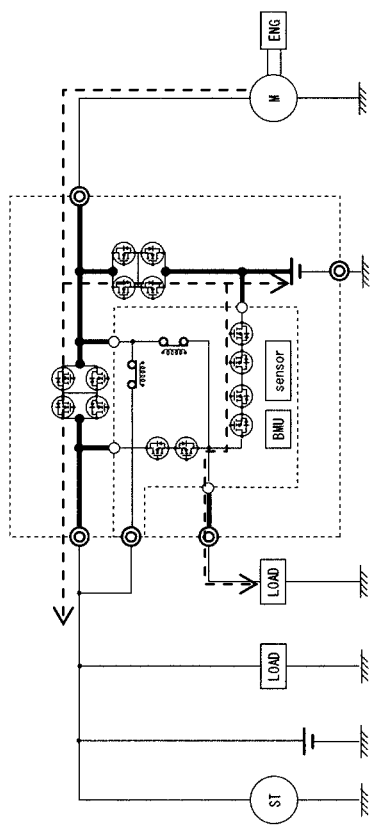
FIG.5(b) 1st POWER GENERATION MODE
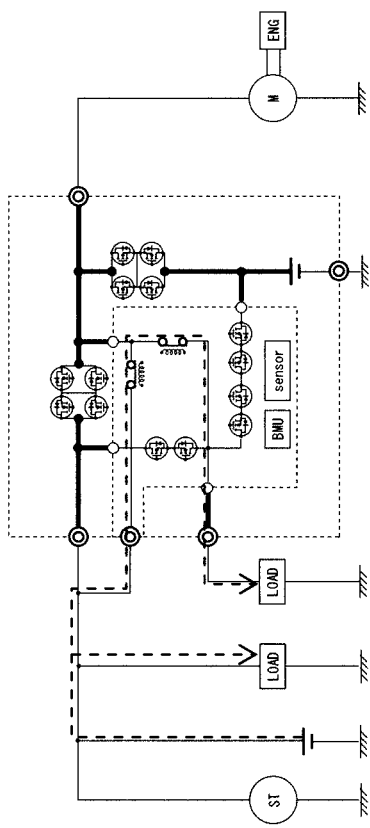
FIG.5(d) PARKING/STOP CONTROL MODE
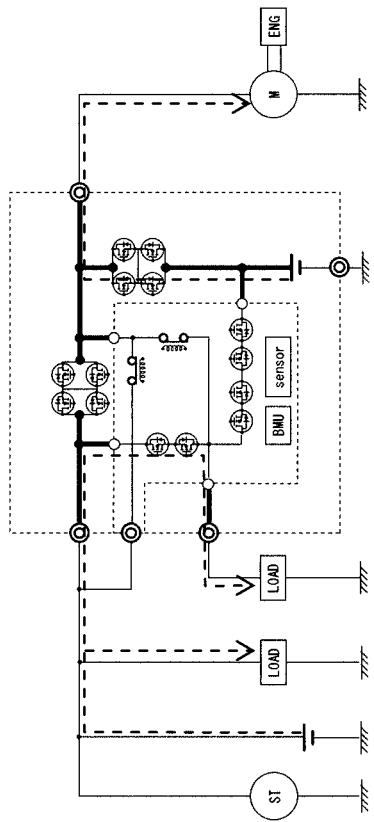
FIG.5(a) Li CRUISE CONTROL MODE
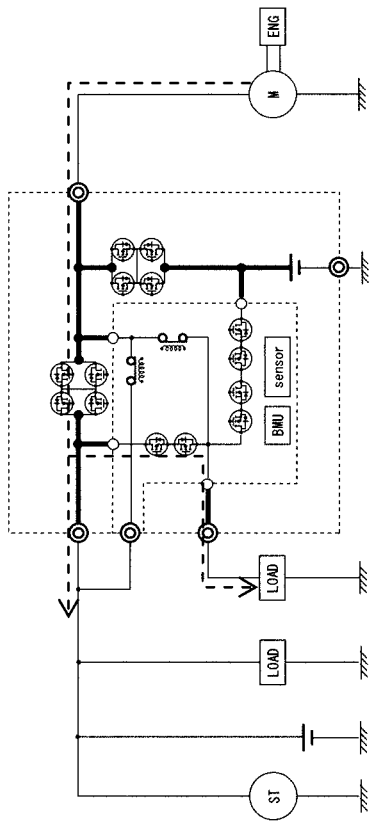
FIG.5(c) 2nd POWER GENERATION MODE though at in

BATTERY PACK

CROSS REFERENCE TO RELATED DOCUMENT

The present application claims the benefit of priority of Japanese Patent Application No. 2017-175065 filed on Sep. 12, 2017, the disclosure of which is incorporated herein by reference.

BACKGROUND

1 Technical Field

This disclosure relates generally to a batter pack equipped with a battery.

2 Background Art

Japanese Patent No. 6001360 teaches a battery unit equipped with an assembled battery made up of a plurality of cells, a control board working to control charging or discharging of the assembled battery, and a casing equipped with a base and a cover. The assembled battery and the control board are firmly mounted on the base.

The base includes a bottom plate and a wall extending upward from the bottom plate. The bottom plate has a heat dissipator disposed on an upper surface thereof. The heat dissipator is laid to face the reverse surface of the control board. Specifically, the heat dissipator has an upper surface facing the control board. The heat dissipator faces an area on the control board in which power devices (i.e., switches) are mounted.

In other words, all the power devices are located above the heat dissipator of the base, thus resulting in an increased size of the base.

SUMMARY

It is an object of this disclosure to provide a battery pack which is capable of being reduced in size and ensuring a required capacity to dissipate heat from switches.

According to one aspect of the disclosure, there is provide a battery pack which comprises: (a) a battery; (b) a circuit board which is equipped with wiring patterns; (c) connecting members which connect with the battery and the circuit board; (d) housing switches which are electrically connected to the connecting members; (e) board switches which are electrically connected to the wiring patterns; and (f) a housing in which the battery, the circuit board, the connecting members, the housing switches, and the board switches are disposed.

The housing is higher in capacity of heat dissipation than the circuit board. The housing switches are disposed in the housing. The board switches are mounted on the circuit board. An average amount per unit time of electrical current flowing through the housing switches is larger than that flowing through the board switches.

Specifically, the housing switches which are larger in average amount per unite time of current flowing therethrough are mounted in the housing which is higher in capacity to dissipate heat than the circuit board. The board switches which are smaller in average amount per unit time of current flowing therethrough are disposed on the circuit board which is lower in capacity to dissipate heat than the housing. This enables the size of the battery pack to be reduced without sacrificing the dissipation of heat from the switches.

In this disclosure, symbols in brackets represent correspondence relation between terms in claims and terms described in embodiments which will be discussed later, but are not limited only to parts referred to in the disclosure.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 3 is a table which lists switching patterns for switches mounted in a battery pack;

FIGS. 4(a), 4(b), 4(c), and 4(d) are views which demonstrate flows of electrical current in switching control modes;

FIGS. 5(a), 5(b), 5(c), and 5(d) are views which demonstrate flows of electrical current in switching control modes;

DESCRIPTION OF THE PREFERRED EMBODIMENTS

Figure 1:
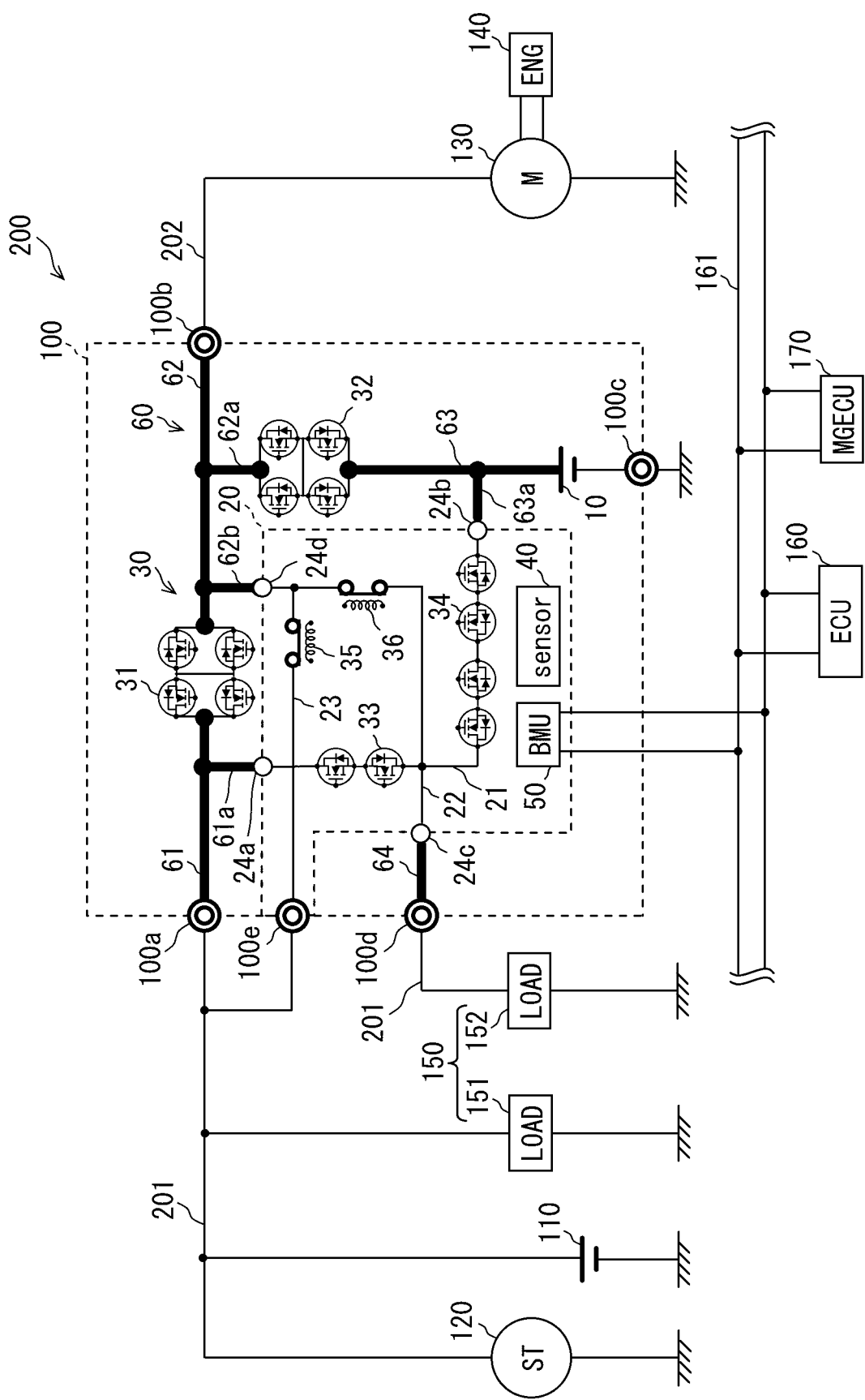
FIG. 1 is a circuit diagram which illustrates a structure of an electric power system.

Embodiments will be described below with reference to the drawings.

First Embodiment

The battery pack 100 and the electric power system 200 including the battery pack 100 according to the first embodiment will be described below with reference to FIGS. 1 to 5.

Electric Power System

The electric power system 200 is mounted in a vehicle such as an automobile. The electric power system 200 includes a plurality of in-vehicle devices mounted in the vehicle and the battery pack 100. One of the in-vehicle devices is the lead acid battery 110. The battery pack 100 is equipped with the assembled battery 10. The electric power system 200 constitutes a double power system made up of the lead acid battery 110 and the assembled battery 10.

One of the in-vehicle devices is the engine 140 such as an internal combustion engine. The vehicle in which the electric power system 200 is installed is equipped with an idle stop mode (also called an automatic engine stop and restart mode) which stops the engine 140 when a given engine stop condition is met and restarts the engine 140 when a given engine restart condition is met.

The electric power system 200 is, as illustrated in FIG. 1, also equipped with the starter motor 120, the rotating electrical machine 130, the electrical loads 150, the host ECU 160, and the MGECU 170 in addition to the lead acid battery 110 and the engine 140. The lead acid battery 110, the starter motor 120, and the electrical loads 150 are electrically connected to the battery pack 100 through the first wire harness 201. The rotating electrical machine 130 is electrically connected to the battery pack 100 through the second wire harness 202.

The host ECU 160 and the MGECU 170 are electrically connected to the lead acid battery 110 and the battery pack 100 through electrical conductors, not shown. Similarly, other types of ECUs (Electronic Control Units) are electrically connected to the lead acid battery 110 and the battery pack 100 through electrical conductors, not shown.

The electric power system 200 is, as described above, engineered as a double power system equipped with two electrical power supplies: the lead acid battery 110 and the battery pack 100 (i.e., the assembled battery 10).

The lead acid battery 110 usually generates an electromotive force through chemical reaction. The lead acid battery 110 has a larger storage capacity than the assembled battery 10 and serves as an external power supply.

The starter motor 120 works to start the engine 140. Specifically, when it is required to start the engine 140, the starter motor 120 is mechanically connected to the engine 140. The starter motor 120 rotates to rotate a crankshaft of the engine 140. When the rotational speed of the crankshaft of the engine 140 exceeds a given value, a fuel injector stars to spray fuel into a combustion chamber of the engine 140. A spark plug then produces a spark in the combustion chamber, so that the fuel is combusted, thereby causing the engine 140 to self-rotate to produce torque, so that the vehicle travels. When the engine 140 has started to self-rotate, the starter motor 120 is mechanically disconnected from the engine 140.

The rotating electrical machine 130 operates selectively in a motor mode and a power generation mode. The rotating electrical machine 130 is connected to an inverter, not shown. The inverter is electrically connected to the second wire harness 202. The rotating electrical machine 130 will also be referred to below as a first electrical load.

The ECUs are electrically connected to each other using a bus bar 161 to develop an in-vehicle network. The ECUs work in a coordinated way to control fuel combustion in the engine 140 and a power generation mode or a motor mode of the rotating electrical machine 130. The host ECU 160 works to control an operation of the battery pack 100. The MGECU 170 works to control an operation of the rotating electrical machine 130.

The inverter works to convert dc voltage, as delivered from at least one of the lead acid battery 110 and the assembled battery 10 of the battery pack 100, into ac voltage which is then delivered to the rotating electrical machine 130, so that the rotating electrical machine 130 operates in the motor mode.

The rotating electrical machine 130 is connected to the engine 140. The rotating electrical machine 130 and the engine 140 are coupled with each other through a belt to achieve transmission of rotational energy therebetween. Specifically, the rotational energy, as produced by the rotating electrical machine 130 in the motor mode, is transmitted to the engine 140, thereby facilitating rotation of the engine 140 to assist in moving the vehicle. The vehicle equipped with the electric power system 200 operates in the idle stop mode. The rotating electrical machine 130 works not only to assist the movement of the vehicle, but also to rotate the crankshaft to re-start the engine 140.

The rotating electrical machine 130 is also engineered to generate electricity using at least one of the rotational energy produced by the engine 140 and the rotational energy produced by wheels of the vehicle. The rotating electrical machine 130 outputs ac voltage in the power generation mode, which is then converted by the inverter into dc voltage. The dc voltage is supplied to the battery pack 100, the lead acid battery 110, and the electrical loads 150.

The engine 140 works to burn fuel therein to produce driving power for the vehicle. When it is required to start the engine 140, the starter motor 120, as described above, rotates the crankshaft. Alternatively, when it is required to restart the engine 140 after being stopped in the idle stop mode, and the above described restart condition is met, the rotating electrical machine 130 works to rotate the crankshaft.

The electrical loads 150 include the general load 151 and the protection load 152. The general load 151 is, for example, an in-vehicle device, such as a seat heater, a blower fan, an electrical compressor, an interior light, or a headlight, to which constant electrical power does not necessarily need to be supplied. The protection load 152 is, for example, an in-vehicle device, such as an electrical shift position sensor, an electrical power steering (EPS) system, an antilock braking system (ABS), a door lock system, a navigation system, or an audio system, to which constant electric power always needs to be supplied. The protection load 152 will be switched from the on-state to the off-state when the voltage supplied thereto drops below a reset threshold level. The protection load 152 generally includes an in-vehicle device which is more relevant to driving of the vehicle than the general load 151. The protection load 152 will also be referred to below as a second electrical load.

Each of the host ECU 160 and the MGECU 170 is one of the ECUs installed in the vehicle. The ECUs are electrically connected to each other using the bus bar 161 to develop an in-vehicle network. The ECUs work in a coordinated way to control fuel combustion in the engine 140 and the power generation mode or the motor mode of the rotating electrical machine 130. The host ECU 160 works to control an operation of the battery pack 100. The MGECU 170 works to control an operation of the rotating electrical machine 130.

Although not illustrated, the electric power system 200 also includes sensors serving to measure a physical quantity, such as a voltage or an electrical current, and obtain vehicle information about a position of an accelerator pedal or an open position of a throttle valve. Outputs of such sensors are transmitted to the ECUs.

Battery Pack

The battery pack 100 will be described below. The battery pack 100 is, as illustrated in FIG. 1, equipped with external connecting terminals, as indicated by as indicated by double circles. The external connecting terminals include the first external connecting terminal 100a, the second external connecting terminal 100b, the third external connecting terminal 100c, the fourth external connecting terminal 100d, and the fifth external connecting terminal 100e.

The first external connecting terminal 100a, the fourth external connecting terminal 100d, and the fifth external connecting terminal 100e are electrically connected to the lead acid battery 110, the starter motor 120, and the electrical loads 150 through the first wire harness 201. The second external connecting terminal 100b is electrically connected to the rotating electrical machine 130 through the second wire harness 202. The third external connecting terminal 100c is attached to a body of the vehicle using a bolt. The bolt inserted into the third external connecting terminal 100c serves as a fastener to join the battery pack 100 and the body of the vehicle together, thereby connecting the battery pack 100 to ground.

The first wire harness 201, as illustrated in FIG. 1, includes two conductors: one connecting with the lead acid battery 110, the starter motor 120, and the general load 151, and the second connecting with the protection load 152. The first conductor of the first wire harness 201 which connects with the lead acid battery 110, the starter motor 120, and the general load 151 has an end from which two branch lines diverge. One of the branch lines is connected to the first external connecting terminal 100a. The other branch line is connected to the fifth external connecting terminal 100e. The second conductor of the first wire harness 201 which leads to the protection load 152 has an end coupled with the fourth external connecting terminal 100d.

Figure 2:
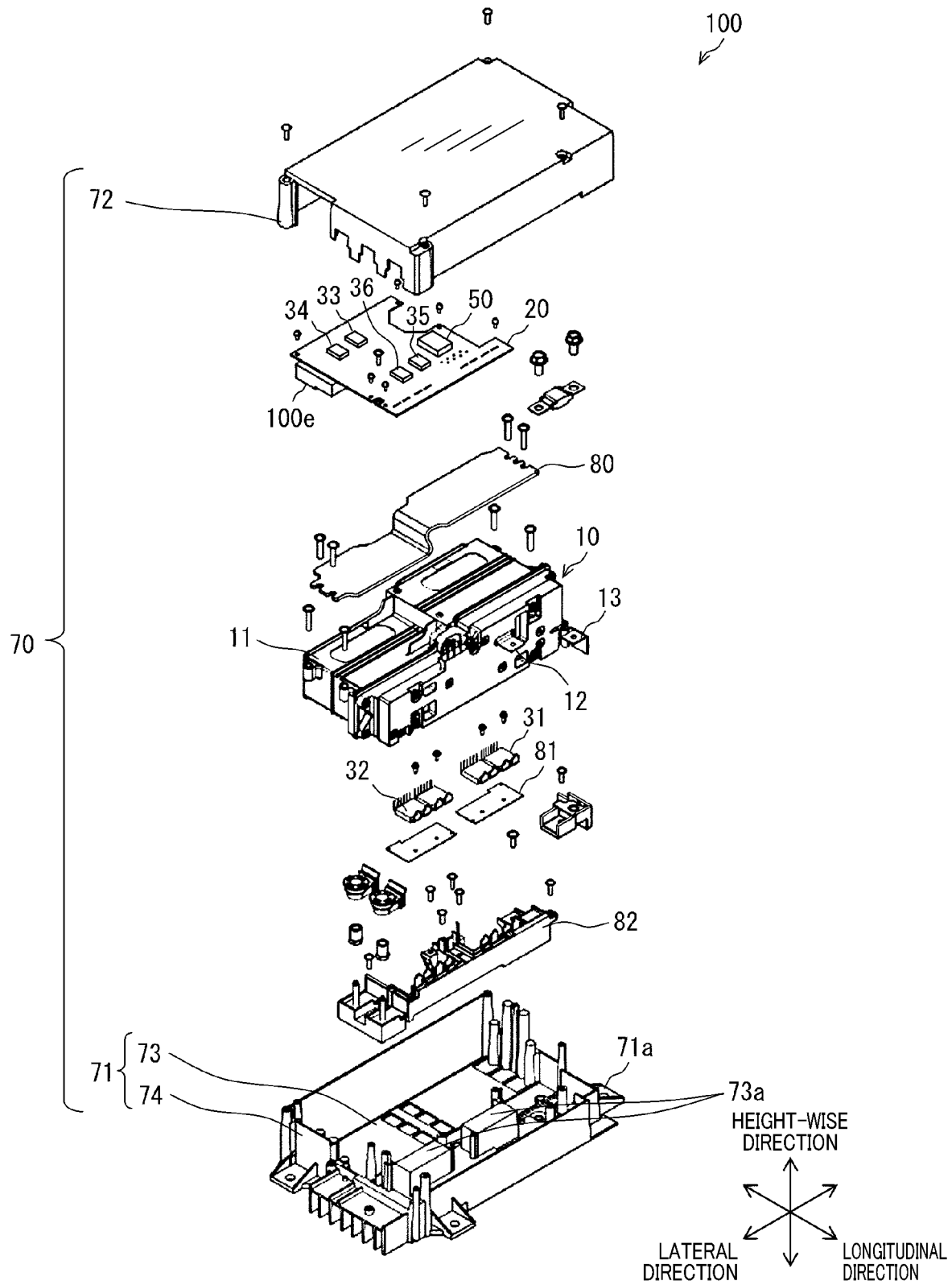
FIG. 2 is an exploded perspective view which illustrates a structure of a battery pack.

The battery pack 100, as clearly illustrated in FIG. 1, includes the assembled battery 10, the circuit board 20, the switches 30, the sensor unit 40, the BMU 50, and the bus bar 60. The battery pack 100 is, as illustrated in FIG. 2, equipped with the case 70.

The case 70 includes the housing 71 and the cover 72. The housing 71 and the cover 72 define a storage chamber in which the assembled battery 10, the circuit board 20, the switches 30, the sensor unit 40, the BMU 50, and the bus bar 60 are mounted.

In the following discussion, three directions perpendicular to each other will be referred to as a lateral direction, a longitudinal direction, and a height-wise direction. The longitudinal direction is a direction in which the vehicle travels forward or backward. The lateral direction is a transverse direction of the vehicle. The height-wise direction is a vertical direction of the vehicle. When the vehicle is at rest on a horizontal plane, the direction in which the vehicle travels forward or backward and the transverse direction are horizontal. The vertical direction is perpendicular to the horizontal plane.

The assembled battery 10 is smaller in size and weight than the lead acid battery 110. The assembled battery 10 is higher in energy density than the lead acid battery 110. The assembled battery 10 will also be simply referred to as a battery.

The assembled battery 10 includes a plurality of cells connected in series and the battery casing 11 in which the cells are disposed. The battery casing 11 has formed therein holes through which bolts pass. The housing 71 of the case 70 has formed therein bolt holes into which the bolts are fastened. The joining of the battery casing 11 to the housing 71 is achieved by passing the bolts into the holes of the battery casing 11.

The battery casing 11 is also secured to the housing 71 using the holding plate 80. The holding plate 80 faces the housing 71 through the assembled battery 10 in the height-wise direction. The holding plate 80 has formed therein cut-outs through which bolts pass. The housing 71 has formed therein bolt holes into which the bolts are screwed. The joining of the holding plate 80 to the housing 71 is achieved by passing the bolts into the cut-outs of the holding plate 80 and the bolt holes of the housing 71.

The circuit board 20 is laid to partially overlap the assembled battery 10 in the height-wise direction. Some of the switches 30 are disposed on a portion of the circuit board 20 which overlaps with the assembled battery 10. The remaining switches 30 are mounted on the housing 71 through the insulating film 81. The switches 30 disposed on the housing 71 have control electrodes electrically connected to the circuit board 20 through internal connecting members. The circuit board 20 also has the BMU 50 mounted thereon. The above described electrical parts constitute an electrical circuit to which the sensor unit 40 is electrically connected.

The electrical circuit of the battery pack 100 is electrically connected to the first external connecting terminal 100a, the second external connecting terminal 100b, the assembled battery 10, and the fourth external connecting terminal 100d through the bus bar 60 shown in FIG. 1. The circuit board 20 has disposed thereon a connector serving as the fifth external connecting terminal 100e. The electrical circuit is, thus, connected directly with the fifth external connecting terminal 100e. The first wire harness 201 is connected directly to the fifth external connecting terminal 100e. The bus bar 60 has a portion arranged on the resinous mount 82 shown in FIG. 2.

With the above arrangements, the electrical circuit of the battery pack 100 is electrically connected to the lead acid battery 110, the starter motor 120, the rotating electrical machine 130, the assembled battery 10, and the electrical loads 150. The electrical circuit is connected to a body of the vehicle using a bolt fastened into the third external connecting terminal 100c.

Battery Pack

The battery pack 100 will be described below.

The assembled battery 10 includes lithium-ion cells which develop voltage in electrochemical reaction to produce a flow of electrical current through the cell. This will generate heat to produce gas, so that the cells usually expand. The cells of the assembled battery 10 may alternatively be implemented by nickel-hydrogen secondary cells or organic radical cells.

Each of the cells is of a quadratic prism shape and thus has six faces. Specifically, each of the cells has a first major surface and a second major surface opposed to each other in the height-wise direction. The first and second major surfaces are larger in area than the other surfaces of each of the cells. Each of the cells is, thus, of a flattened shape having a thickness between the first major surface and the second major surface.

The assembled battery 10 is equipped with five cells. Three of the five cells are laid on each other in the height-wise direction to form a first cell stack. The other two are also laid on each other in the height-wise direction to form a second cell stack. The first and second cell stacks are arranged adjacent each other in the lateral direction. The layout of the five cells is maintained by the battery casing 11. The expansion of the battery casing 11 arising from swelling of the cells is suppressed by the holding plate 80.

The battery casing 11 includes a resinous body and conductors insert-molded in the body. The conductors include series-connecting terminals through which the five cells are electrically connected in series. The series-connecting terminals are partially exposed outside the body of the battery casing 11. The exposed portions are placed in contact with electrode terminals of the cells and laser-welded together, thereby achieving a series-connection of the five cells.

The conductors also include the output terminal 12 and the ground terminal 13. The output terminal 12 connects with a positive terminal of one of the series-connected cells which is the highest in potential. The ground terminal 13 connects with a negative terminal of one of the series-connected cells which is the lowest in potential. The output terminal 12 and the ground terminal 13 are, as clearly illustrated in FIG. 2, exposed outside the body of the battery casing 11. The output terminal 12 is laser-welded to the positive terminal of one of the cells which is the highest in potential. Similarly, the ground terminal 13 is laser-welded to the negative terminal of one of the cells which is the lowest in potential.

The circuit board 20 is made of a printed circuit board which includes an insulating substrate and with conductive wiring patterns printed on or in the insulating substrate. The circuit board 20 is secured to the housing 71 using bolts.

The wiring patterns on the circuit board 20 include the first load feed wire 21, the second load feed wire 22, and the third load feed wire 23. The circuit board 20 has also formed thereon terminals electrically connecting with the wiring patterns. The terminals include the first inner terminal 24*a*, the second inner terminal 24*b*, and the third inner terminal 24*c*. The circuit board 20 has the fifth external connecting terminal 100*e* disposed thereon as the above connector. The fifth external connecting terminal 100*e* is also electrically connected to the wiring pattern. Electrical connections of the wiring patterns with the inner terminals and the fifth external connecting terminal 100*e* will also be discussed in later explanation of the circuit structure of the battery pack 100.

The switches 30 include the first switch 31, the second switch 32, the third switch 33, the fourth switch 34, the fifth switch 35, and the sixth switch 36. The first switch 31 and the second switch 32 are, as illustrated in FIG. 2, mounted on the housing 71. The third switch 33, the fourth switch 34, the fifth switch 35, and the sixth switch 36 are arranged on an area of the circuit board 20 which faces the assembled battery 10. More specifically, the third switch 33 and the fourth switch 34 are located closer to a portion of the circuit board 20 bolted to the housing 71 than the fifth switch 35 and the sixth switch 36 are.

The first switch 31 and the second switch 32 will also be referred to as housing switches. The third switch 33 to the sixth switch 36 will also be referred to as board switches. The fifth switch 35 and the sixth switch 36 will also be referred to as bypass switches.

The first switch 31 to the fourth switch 34 include semiconductor switches. Specifically, the first switch 31 to the fourth switch 34 are implemented by N-channel MOSFETs. The fifth switch 35 and the sixth switch 36 work as mechanical relays. Specifically, each of the fifth switch 35 and the sixth switch 36 is made of a normally-closed solenoid relay. The semiconductor switches may be implemented by IGBTs to which diodes are connected in parallel.

Each of the first switch 31 to the fourth switch 34 includes at least one switching device made of two MOSFETs connected in series with each other. The two MOSFETs have sources coupled with each other and gates electrically separate from each other. The MOSFETs are equipped with parasitic diodes whose anodes are electrically connected together.

The first switch 31 and the second switch 32 are each equipped with a plurality of switching devices which are connected in parallel to each other and whose sources are electrically connected together.

The third switch 33 is equipped with a single switching device. The fourth switch 34 is equipped with a plurality of switching devices which are connected in series with each other.

FIG. 1 illustrates the first switch 31 and the second switch 32 each of which is equipped with two switching devices connected in parallel to each other. FIG. 1 also illustrates the fourth switch 34 equipped with two switching devices connected in series with each other. The number of the switching devices may be determined depending upon a required amount of electrical current or required redundancy.

The first switch 31 and the second switch 32 are, as described later in detail, designed to have a larger average amount per unit time of current flowing therethrough than the third switch 33 to the sixth switch 36. Each of the first switch 31 and the second switch 32, as described above, has a plurality of switching devices connected in parallel. The first switch 31 and the second switch 32 are, as will be described later in detail, mounted on the housing 71 which is higher in capacity of heat dissipation than the circuit board 20.

Each of the first switch 31 to the fourth switch 34 is equipped with a resinous cover in which the switching devices are sheathed. The resinous cover is of a rectangular parallelepiped shape with two major surfaces which are larger in area than the others and opposed to each other in the height-wise direction. Each of the resinous covers is, thus, of a flattened shape having a thickness between the first major surface and the second major surface.

The resinous cover of each of the first switch 31 and the second switch 32 has a bolt hole passing through the first and second major surfaces thereof. The bottom wall 73 of the housing 71 has heat dissipators 73*a* protruding therefrom. Each of the heat dissipators 73*a* has a mount hole formed in an upper surface thereof in alignment with a corresponding one of the bolt holes of the resinous covers of the first and second switches 31 and 32. Joining of the first switch 31 and the second switch 32 to the housing 71 is achieved by fastening bolts into the bolt holes and the mount holes. The first or second major surface of the resinous cover of each of the first and second switches 31 and 32 is thermally joined to the upper surface of the housing 71 through an insulating film.

FIG. 2 illustrates the heat dissipators 73*a* disposed on the housing 71 one for each of the first switch 31 and the second switch 32. The heat dissipators 73*a* may alternatively be made of a one-piece member.

The sensor unit 40 is, as described already, electrically connected to the electrical circuit. The sensor unit 40 is equipped with sensors which monitors states of the assembled battery 10 and the switches 30. The sensors installed in the sensor unit 40 include a temperature sensor, a current sensor, and a voltage sensor.

The sensor unit 40 serves to measure the temperature of, electrical current from, and voltage at the assembled battery 10 and outputs them in the form of condition signals to the BMU 50. The sensor unit 40 also serves to measure the temperature, electrical current flowing through, and voltage at the switches 30 and outputs them in the form of condition signals to the BMU 50.

The sensor unit 40 also includes a water damage sensor. The water damage sensor is equipped with a first electrode and a second electrode which face each other. When there is water between the first and second electrodes, it will produce a flow of current between the first and second electrodes, thus resulting in a change in electrical resistance therebetween. The sensor unit 40 outputs such a change in resistance in the form of a condition signal to the BMU 50. The BMU 50 monitors whether a change in resistance of the water damage sensor continues for a given period of time or not to determine whether the battery pack 100 is submerged in water or not.

The BMU 50 works to control the operations of the switches 30 in response to the condition signals from the sensor unit 40 and/or command signals from the host ECU 160. The BMU 50, as described above, serves as a battery management unit.

The BMU 50 analyzes the condition signals from the sensor unit 40 to calculate the state of charge (SOC) of the assembled battery 10 and diagnose the operations of the switches 30. The BMU 50 outputs signals indicative of the calculated value of the state of charge of the assembled battery 10 and the diagnosis of the switches 30 to the host ECU 160.

The host ECU 160 analyzes the outputs from the BMU 50 and vehicle information inputted from the ECUs to determine how to control the operations of the switches 30. The host ECU 160 outputs command signals including control signals for the switches 30 to the BMU 50.

The BMU 50 is responsive to the command signals from the host ECU 160 to control the operations of the switches 30. Such switching control will be described later in detail. When determining that the battery pack 100 is submerged in water using the condition signal outputted form the water damage sensor, the BMU 50 decides in itself that the control signals should be stopped from being outputted to the switches 30 and then actually stops outputting the control signals to the switches 30, thereby blocking the electrical connections with the assembled battery 10.

The bus bar 60 is made from conductive material such as copper. The bus bar 60 may be produced in the following ways. The bus bar 60 may be formed by bending a single flat plate. The bus bar 60 may alternatively be formed by joining a plurality of flat strips together. The bus bar 60 may be formed by welding a plurality of flat strips together. The bus bar 60 may be formed by pouring a molten conductive material into a mold. How to produce the bus bar 60 is not limited to the above ways. For instance, the bus bar 60 may alternatively be made using an insulating electric wire. The bus bar 60 is used as a connecting member in this disclosure.

The bus bar 60 of the battery pack 100 include the first bus bar 61, the second bus bar 62, the third bus bar 63, and the fourth bus bar 64 which electrically connect the electrical circuit, the assembled battery 10, and the electrical circuit with the external connecting terminals. FIG. 1 represents the first bus bar 61, the second bus bar 62, the third bus bar 63, and the fourth bus bar 64 using thicker lines than the load feed lines of the circuit board 20.

The housing 71 of the case 70 is made by aluminum-die casting. The housing 71 may alternatively be made by pressing an iron or stainless steel material. The housing 71 includes the bottom wall 73 and the side wall 74. The side wall 74 defines an upper opening facing in the vertical direction when the vehicle is on a horizontal plane. The upper opening is closed by the cover 72, thereby defining an inner storage chamber. The cover 72 is made of resin or metallic material.

The bottom wall 73 has formed therein a hole serving as the third external connecting terminal 100c. The bottom wall 73 has flanges 71a attached thereto for joining the housing 71 to the body of the vehicle. Specifically, the flanges 71a and the body of the vehicle is mechanically or thermally joined together using bolts, thereby securing the battery pack 100 to the vehicle.

The housing 71 (i.e., the battery pack 100) is located beneath a seat in the vehicle. The housing 71 (i.e., the battery pack 100) may alternatively be disposed in space between a rear seat and a luggage compartment or between a driver's seat and a front passenger's seat in the vehicle.

Electrical Circuit in Battery Pack

The electrical circuit of the battery pack 100 will be described below with reference to FIG. 1. The first switch 31 has a first end and a second end opposed to the first end. The first external connecting terminal 100a and the first end of the first switch 31 are electrically connected together using the first bus bar 61. The first bus bar 61 has the branch line 61a diverging therefrom. The branch line 61a is brazed to the first inner terminal 24a of the circuit board 20.

The second end of the first switch 31 is electrically connected to the second external connecting terminal 100b through the second bus bar 62. The second bus bar 62 has the branch line 62a diverging therefrom. The second switch 32 has a first end and a second end opposed to the first end. The branch line 62a is connected to the first end of the second switch 32. The second bus bar 62 also has the branch line 62b diverging therefrom between the second end of the first switch 31 and the branch line 62a. The branch line 62b of the second bus bar 62 is brazed to the fourth inner terminal 24d of the circuit board 20.

The second end of the second switch 32 and the positive terminal (i.e., the output terminal 12) of the assembled battery 10 are electrically connected together through the third bus bar 63. The third bus bar 63 has the branch line 63a diverging therefrom. The branch line 63a is brazed to the second inner terminal 24b of the circuit board 20. The negative terminal (i.e., the ground terminal 13) of the assembled battery 10 is electrically connected to the third external connecting terminal 100c.

The first inner terminal 24a and the second inner terminal 24b of the circuit board 20 are electrically connected together through the first load feed wire 21. The third switch 33 and the fourth switch 34 are connected in series on the first load feed wire 21 in this order in a direction from the first inner terminal 24a to the second inner terminal 24b.

The third inner terminal 24c and the fourth inner terminal 24d of the circuit board 20 are electrically connected together through the second load feed wire 22. The third inner terminal 24c is electrically connected to the fourth external connecting terminal 100d through the fourth bus bar 64. The third inner terminal 24c and the fourth bus bar 64 brazed together.

The second load feed wire 22 has the sixth switch 36 disposed thereon. An intermediate point of the second load feed wire 22 between the third inner terminal 24c and the sixth switch 36 is connected to an intermediate point of the first load feed wire 21 between the third switch 33 and the fourth switch 34, thereby achieving a parallel connection of the sixth switch 36 to the third switch 33.

An intermediate point of the second load feed wire 22 between the fourth inner terminal 24d and the sixth switch 36 is electrically connected to the fifth external connecting terminal 100e through the third load feed wire 23. The fifth external connecting terminal 100e has the fifth switch 35 disposed thereon, thereby achieving a parallel connection of the fifth switch 35 to the first switch 31.

With the above arrangements, the first switch 31, the second switch 32, the fourth switch 34, and the third switch 33 are connected together on this order in a circular form. A joint of the first switch 31 and the second switch 32 is connected to the second external connecting terminal 100b. A joint of the second switch 32 and the fourth switch 34 is connected to the assembled battery 10. A joint of the fourth switch 34 and the third switch 33 is connected to the fourth external connecting terminal 100d. A joint of the third switch 33 and the first switch 31 is connected to the first external connecting terminal 100a.

An intermediate point of the second bus bar 62 between the first switch 31 and the second switch 32 is connected to the joint of the fourth switch 34 and the third switch 33 through the sixth switch 36. The intermediate point of the second bus bar 62 between the first switch 31 and the second switch 32 is also connected to the fifth external connecting terminal 100e through the fifth switch 35.

With the above electrical arrangements, turning on or off of the first switch 31 establishes or block the electrical connection between the first external connecting terminal 100a and the second external connecting terminal 100b. In other words, when the first switch 31 is opened or closed, the electrical connection between the lead acid battery 110 and the rotating electrical machine 130 is blocked or achieved.

Turning on or off of the second switch 32 establishes or block the electrical connection of the second external connecting terminal 100b and the assembled battery 10. In other words, when the second switch 32 is opened or closed, the electrical connection of the rotating electrical machine 130 and the assembled battery 10 is blocked or achieved.

Turning on or off of the fourth switch 34 establishes or blocks the electrical connection of the second inner terminal 24b and the third inner terminal 24c. In other words, when the fourth switch 34 is opened or closed, the electrical connection of the assembled battery 10 and the protection load 152 is blocked or achieved.

Turning on or off of the third switch 33 establishes or blocks the electrical connection of the first inner terminal 24a and the third inner terminal 24c. In other words, when the third switch 33 is opened or closed, the electrical connection of the lead acid battery 110 and the protection load 152 is blocked or achieved.

Turning on or off of the sixth switch 36 establishes or blocks the electrical connection of the fourth inner terminal 24d and the third inner terminal 24c. In other words, when the sixth switch 36 is opened or closed, the electrical connection of the rotating electrical machine 130 and the protection load 152 is blocked or achieved.

Turning on or off of the fifth switch 35 establishes or blocks the electrical connection of the fourth inner terminal 24d and the fifth external connecting terminal 100e. In other words, when the fifth switch 35 is opened or closed, the electrical connection of the rotating electrical machine 130 and the lead acid battery 110 is blocked or achieved.

When the fifth switch 35 and the sixth switch 36 are opened or closed simultaneously, the electrical connection of the third inner terminal 24c and the fifth external connecting terminal 100e, that is, between the protection load 152 and the lead acid battery 110 is blocked or achieved.

Switching Control

The typical switching operation of the battery pack 100 will be described below with reference to FIGS. 3 to 5(h). In a table in FIG. 3, "ON" represents a closed state. "OFF" represents an opened state. FIGS. 4(a) to 5(h) represent flows of electrical current using broken arrows and omits the reference numbers for the sake of simplicity of illustration.

The switching control is changed depending upon the SOC (State-Of-Charge) of the lead acid battery 110 or the assembled battery 10 or requirements from the vehicle. The switching patterns in FIGS. 3 to 5(h) are, therefore, merely examples.

FIG. 3 demonstrates (a) a Pb starting control mode, (b) an idle stop control mode, (c) a Li restart control mode, (d) a Pb restart control mode, (e) a Li cruise control mode, (f), a first electric power generation mode, (g) a second electric power generation mode, and (h) and a parking/stop control mode. In seven of these control modes other than (h) the parking/stop control mode, the fifth switch 35 and the sixth switch 36 are each placed in the opened state. The following discussion will, therefore, omit explanation of the opened or closed state of the fifth switch 35 and the sixth switch 36 in seven of the control modes except (h) the parking/stop control mode.

The Pb starting control mode is the switching control mode when it is required to start the vehicle using the starter motor 120. The switching control mode is initiated by the BMU 50 when an ignition switch of the vehicle has been changed from the off-state to the on-state. Specifically, the BMU 50 places the third switch 33 in the closed state and the other three switches in the opened state. This causes, as illustrated in FIG. 4(a), the electrical connection of the lead acid battery 110 and the protection load 152 is achieved by the third switch 33. Power is, therefore, delivered from the lead acid battery 110 to the starter motor 120 and the general load 151. Power is also delivered from the lead acid battery 110 to the protection load 152 through the third switch 33. The starter motor 120 is actuated to crank the engine 140. The Pb starting control mode may alternatively works to close the first switch 31 and the third switch 33 and opens the other two switches.

The idle stop control mode is the switching control mode entered when given stop conditions are met to stop the engine 140. Specifically, the BMU 50 places the first switch 31 and the fourth switch 34 in the closed state and the other two switches in the opened state. This enables the power to be delivered from the lead acid battery 110 to the rotating electrical machine 130 through the first switch 31 when the rotating electrical machine 130 is in the motor mode. The electrical connection of the assembled battery 10 and the protection load 152 is, as demonstrated in FIG. 4(b), established through the fourth switch 34. Power is delivered from the lead acid battery 110 to the general load 151. Power is also delivered from the assembled battery 10 to the protection load 152 through the fourth switch 34. The switching control in the idle stop control mode is the same when the rotating electrical machine 130 is in the off-state, and the vehicle is being driven only by the engine 140.

The Li restart control mode is the switching control mode entered when the SOC of the assembled battery 10 is high, and given restart conditions are met to restart the engine 140. Specifically, the BMU 50 places the second switch 32 and the fourth switch 34 in the closed state and the other two switches in the opened state. This causes the electrical connection of the assembled battery 10 and the rotating electrical machine 130 to be, as illustrated in FIG. 4(c), achieved through the second switch 32. The electrical connection of the assembled battery 10 and the protection load 152 is also achieved through the fourth switch 34. Power is then delivered from the assembled battery 10 to the rotating electrical machine 130 through the second switch 32. Power is also delivered from the assembled battery 10 to the protection load 152 through the fourth switch 34. Power is supplied from the lead acid battery 110 to the general load 151. The switching control in the Li restart control mode is the same when the vehicle is driven by both the engine 140 and the rotating electrical machine 130.

The Pb restart control mode is the switching control mode entered when the SOC of the assembled battery 10 is low, and the given restart conditions are met to restart the engine 140. Specifically, the BMU 50 places the first switch 31 and the fourth switch 34 in the closed state and the other two switches in the opened state. This establishes, as demonstrated in FIG. 4(d), the electrical connection of the lead acid battery 110 and the rotating electrical machine 130 through the first switch 31. The electrical connection of the assembled battery 10 and the protection load 152 is also achieved through the fourth switch 34. Power is delivered from the lead acid battery 110 to the general load 151. Power is also delivered from the lead acid battery 110 to the rotating electrical machine 130 through the first switch 31. Power is also supplied from the assembled battery 10 to the protection load 152 through the fourth switch 34.

The Li cruise control mode is the switching control mode entered when it is required to drive the vehicle using only the rotating electrical machine 130. Specifically, the BMU 50 places the second switch 32 and the third switch 33 in the closed state and the other two switches in the opened state. This achieves, as demonstrated in FIG. 5(a), the electrical connection of the assembled battery 10 and the rotating electrical machine 130 through the second switch 32. The electrical connection of the lead acid battery 110 and the protection load 152 is also achieved through the third switch 33. Power is then delivered from the assembled battery 10 to the rotating electrical machine 130 through the second switch 32. Power is delivered from the lead acid battery 110 to the general load 151. Power is also supplied from the lead acid battery 110 to the protection load 152 through the third switch 33.

The first electric power generation mode is the switching control mode entered when the rotating electrical machine 130 is in the power generation mode, and the SOC of the assembled battery 10 is low. Specifically, the BMU 50 places the first switch 31, the second switch 32, and the fourth switch 34 in the closed state and the third switch 33 in the opened state. This establishes, as demonstrated in FIG. 5(b), the electrical connection of the lead acid battery 110 and the rotating electrical machine 130 through the first switch 31. The electrical connection is also achieved between the assembled battery 10 and the rotating electrical machine 130 through the second switch 32. The electrical connection is also achieved between the protection load 152 and the rotating electrical machine 130 through the second switch 32 and the fourth switch 34. Power, as generated by the rotating electrical machine 130, is therefore delivered to the lead acid battery 110 through the first switch 31 and to the assembled battery 10 through the second switch 32. Power is also supplied to the protection load 152 through the second switch 32 and the fourth switch 34.

The second electric power generation mode is the switching control mode entered when the rotating electrical machine 130 is in the power generation mode, and the SOC of the assembled battery 10 is high. Specifically, the BMU 50 places the first switch 31 and the third switch 33 in the closed state and the other two switches in the opened state. This achieves, as demonstrated in FIG. 5(c), the electrical connection of the lead acid battery 110 and the rotating electrical machine 130 through the first switch 31. The electrical connection between the protection load 152 and the rotating electrical machine 130 is also achieved through the first switch 31 and the third switch 33. Power, as generated by the rotating electrical machine 130, is therefore, delivered to the lead acid battery 110 through the first switch 31 and also to the protection load 152 through the first switch 31 and the third switch 33.

The parking/stop control mode is the switching control mode entered when the ignition switch is in the on-state, and the vehicle is stopped or parked. Specifically, the BMU 50 stops outputting the control signals to the first switch 31 to the fourth switch 34 to place them in the opened state. Similarly, the BMU 50 stops outputting the control signals to the fifth switch 35 and the sixth switch 36. The fifth switch 35 and the sixth switch 36 are, as described already, each implemented by a normally-closed solenoid relay. When the BMU 50 stops outputting the control signals, it, therefore, will cause the fifth switch 35 and the sixth switch 36 to be changed from the opened state to the closed state. This achieves, as demonstrated in FIG. 5(d), the electrical connection of the lead acid battery 110 and the protection load 152 through the fifth switch 35 and the sixth switch 36. Power is, therefore, delivered from the lead acid battery 110 to the general load 151 and also to the protection load 152 through the fifth switch 35 and the sixth switch 36.

As apparent from the above discussion, the first switch 31 which is disposed between the lead acid battery 110 and the rotating electrical machine 130 has a flow of current passing therethrough when the rotating electrical machine 130 is in the motor mode and the power generation mode. Similarly, the second switch 32 which is disposed between the assembled battery 10 and the rotating electrical machine 130 has a flow of current passing therethrough when the rotating electrical machine 130 is in the motor mode and the power generation mode.

In contrast, the third switch 33 which is disposed between the lead acid battery 110 and the protection load 152 has an amount of current passing therethrough which depends upon an amount of electrical power required by the protection load 152. Similarly, the fourth switch 34 which is arranged between the assembled battery 10 and the protection load 152 has an amount of current passing therethrough which depends upon an amount of electrical power required by the protection load 152.

The amount of current flowing through the first switch 31 and the second switch 32 when the rotating electrical machine 130 is operating in the motor mode or the generation mode depends upon the power required by the rotating electrical machine 130 to operate in the motor mode or generated by the rotating electrical machine 130 in the generation mode and the amount of charge required by the lead acid battery 110 and the assembled battery 10. The required amount of power or the required amount of charge are usually greater than the amount of power required by the protection load 152. This causes a larger average amount per unit time of current to flow through the first switch 31 and the second switch 32 than the third switch 33 and the fourth switch 34, so that the first switch 31 and the second switch 32 will generate an amount of heat greater than that generated by the third switch 33 and the fourth switch 34.

The fifth switch 35 and the sixth switch 36 are, as described above, arranged between the lead acid battery 110 and the protection load 152. The fifth switch 35 and the sixth switch 36 have a flow of current passing therethrough when the vehicle is stopped. Such an amount of current depends upon an amount of power required by the protection load 152. The average amount of current per unit time flowing through each of the fifth switch 35 and the sixth switch 36 will, thus, be smaller than that flowing through the first switch 31 and the second switch 32.

The average amount per unit time of current, as referred to in the above discussion, is defined. This is because the above relation in amount of current between each of the fifth switch 35 and the sixth switch 36 and each of the first switch 31 and the second switch 32 may be instantaneously inverted when it is defined on the basis of unit time. The period of time required to calculate the average amount of current is, for example, a time interval between start and stop of the vehicle.

Beneficial Advantages

The larger average amount per unit time of current, as described above, flows through the first switch 31 and the second switch 32 than the third switch 33 to the sixth switch 36. The first switch 31 and the second switch 32, therefore, usually generate a large amount of heat than the third switch 33 to the sixth switch 36.

The first switch 31 and the second switch 32 are, as described above, bolted to the heat dissipators 73a of the housing 71 through the insulating films 81, so that the heat, as generated by the first switch 31 and the second switch 32, is transmitted to the heat dissipators 73a and then released to the body of the vehicle through the flanges 71a of the housing 71 or outside the case 70. This effectively cools the first switch 31 and the second switch 32.

The third switch 33 to the sixth switch 36 are located in an area of the circuit board 20 which faces the assembled battery 10. This eliminates the need for heat dissipators on which the third switch 33 to the sixth switch 36 are mounted unlike the structure in which all the switches 31 to 36 are installed together in the housing 71, thereby enabling the housing 71 to be reduced in size thereof, which leads to a decreased overall size of the battery pack 100.

The third switch 33 and the fourth switch 34 are located closer to a portion of the circuit board 20 which is bolted to the housing 71 than the fifth switch 35 and the sixth switch 36 are.

The third switch 33 and the fourth switch 34 are, as already referred to in the discussion of the switching control, more frequently energized than the fifth switch 35 and the sixth switch 36, so that they will generate a larger amount of heat than the fifth switch 35 and the sixth switch 36. The third switch 33 and the fourth switch 34 are arranged closer to the portion of the circuit board 20 bolted to the housing 71 which serves as a heat dissipating path, thereby facilitating release of heat from the third switch 33 and the fourth switch 34. This avoids a risk that the heat, as generated by the switches 31 to 36, exceeds an upper limit of a heat resistance of the circuit board 20.

The portion of the circuit board 20 bolted to the housing 71 may be located away from the heat dissipators 73a, thereby minimizing a risk that the heat of the heat dissipators 73a disturbs transmission of heat of the circuit board 20 to the housing 71.

The fifth switch 35 and the sixth switch 36 may alternatively be arranged closer to the portion of the circuit board 20 bolted to the housing 71 than the third switch 33 and the fourth switch 34 are.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modifications to the shown embodiment which can be embodied without departing from the principle of the invention as set forth in the appended claims.

First Modification

Figure 6:
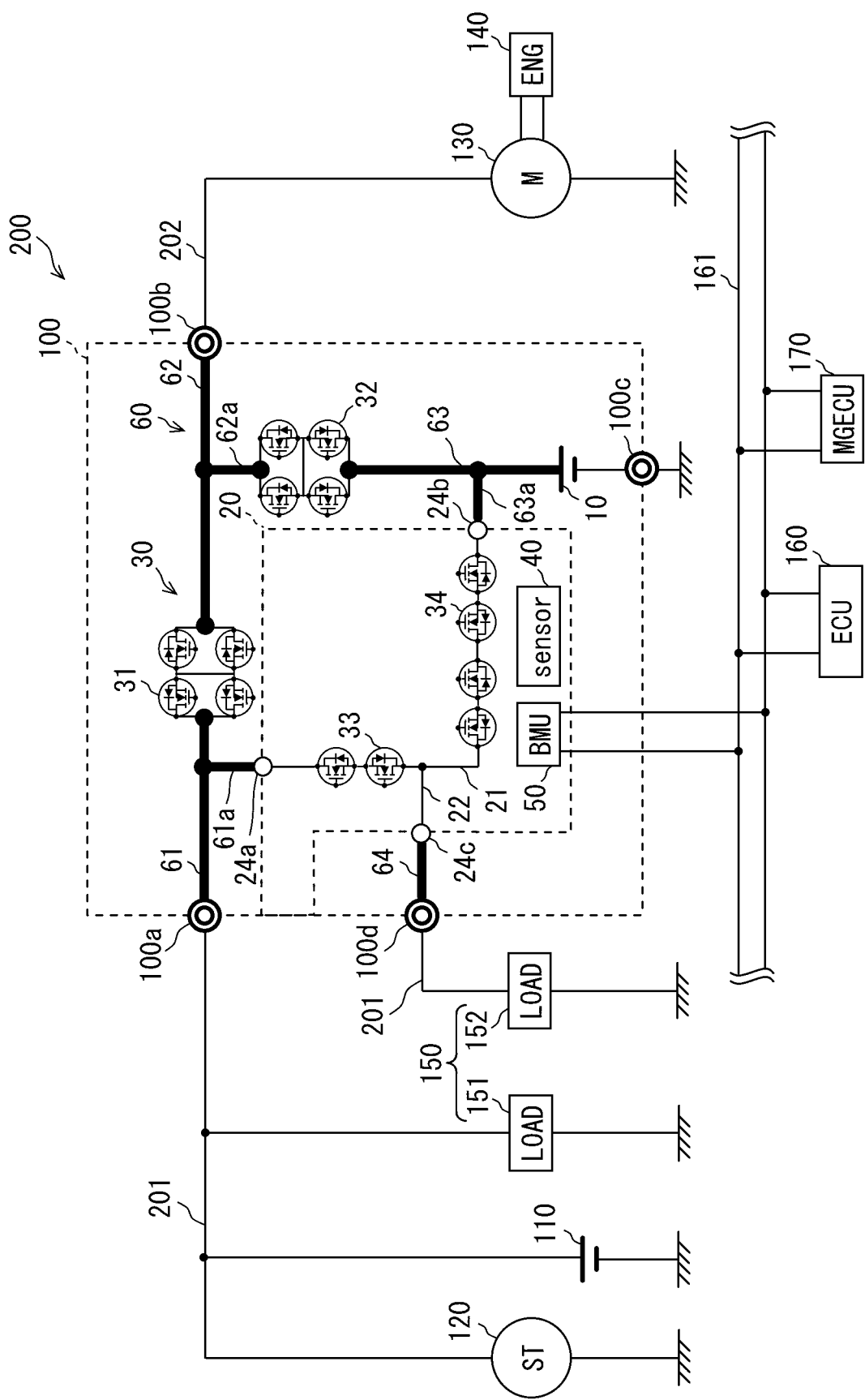
FIG. 6 is a circuit diagraph which illustrates a structure of a battery pack installed in an electric power system in the first modification.

The battery pack 100 in the first embodiment is equipped with the switches 30 including the first switch 31 to the sixth switch 36, but however, the switches 30 may, as illustrated in FIG. 6, include only the first switch 31 to the fourth switch 34.

Second Modification

Figure 7:
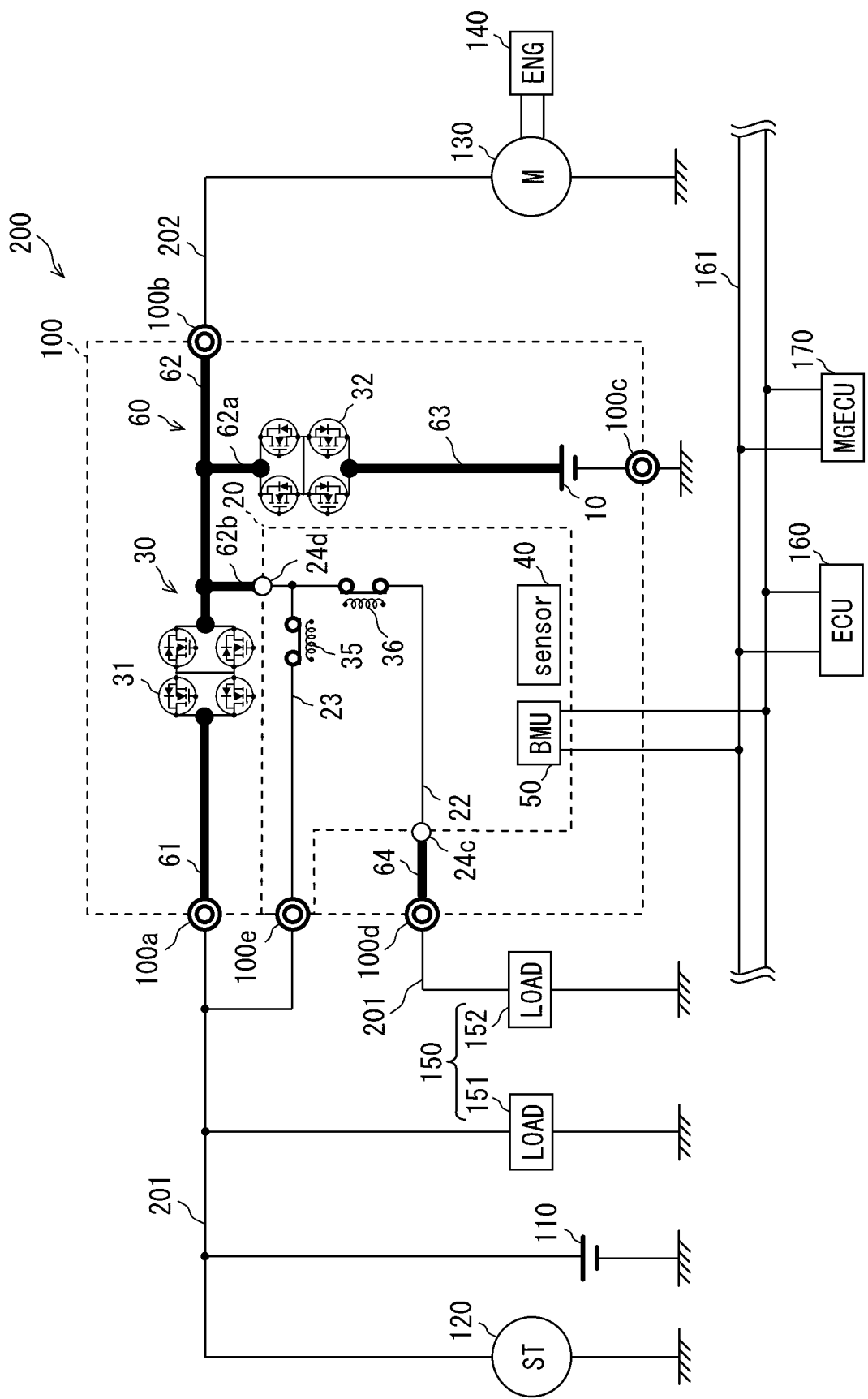
FIG. 7 is a circuit diagraph which illustrates a structure of a battery pack installed in an electric power system in the second modification.

The switches 30 may, as illustrated in FIG. 7, include only the first switch 31, the second switch 32, the fifth switch 35, and the sixth switch 36.

Third Modification

The assembled battery 10 in the above embodiment is equipped with five cells, but may alternatively be designed to have a plurality of cells. The number of cell stacks may be more than two. Each of the cell stacks may be designed to have the cells arranged laterally, not vertically.

Fourth Modification

The embodiment exemplifies the vehicle which is equipped with the electric power system 200 and designed to have the idle stop mode, however, the electric power system 200 may alternatively be mounted in hybrid vehicles or electrical vehicles. In such a case, a motor-generator is used instead of a combination of the starter motor 120 and the rotating electrical machine 130.

What is claimed is:

1. A battery pack comprising:
a battery;
a circuit board which is equipped with wiring patterns;
connecting members which connect with the battery and the circuit board;
housing switches which are electrically connected to the connecting members;
board switches which are electrically connected to the wiring patterns; and
a housing in which the battery, the circuit board, the connecting members, the housing switches, and the board switches are disposed, wherein
the housing is higher in capacity of heat dissipation than the circuit board,
the housing switches are mounted on the housing so that a surface of each of the housing switches is joined to a surface of the housing containing a heat dissipator that protrudes from a wall of the housing, and the housing switches are not mounted on the circuit board,
the board switches are mounted on the circuit board, and
an average amount per unit time of electrical current flowing through the housing switches is larger than the average amount per unit time of electrical current flowing through the board switches.

2. The battery pack as set forth in claim 1, wherein the housing switches include a first switch and a second switch, the first switch being disposed between an external power supply and a first electrical load and working to selectively establish or block electrical connection between the external power supply and the first electrical load, the second switch being disposed between the battery and the first electrical load and working to selectively establish or block electrical connection between the battery and the first electrical load.

3. The battery pack as set forth in claim 2, wherein the board switches includes a third switch and a fourth switch, the third switch being disposed between a second electrical load and the external power supply and working to selectively establish or block electrical connection between the second electrical load and the external power supply, the second electrical load being lower in required amount of power than the first electrical load, the fourth switch being disposed between the second electrical load and the battery and working to selectively establish or block electrical connection between the second electrical load and the battery.

4. The battery pack as set forth in claim 2, wherein the board switches include a bypass switch which is disposed between a second electrical load and the external power supply and works to selectively establish or block electrical connection between the second electrical load and the external power supply, the second electrical load being lower in required amount of power than the first electrical load.

5. The battery pack as set forth in claim 4, wherein the bypass switch includes a fifth switch and a sixth switch which are connected in series with each other and the second electric load, the sixth switch being disposed between the second electrical load and the fifth switch, and wherein an intermediate point between the fifth switch and the sixth switch is connected to the first electrical load.

6. The battery pack as set forth in claim 1, wherein the circuit board is laid to face the battery within the housing, and the board switches are mounted in an area on the circuit board which faces the battery.

7. The battery pack as set forth in claim 1, wherein the housing switches are separate from the board switches.

8. The battery pack as set forth in claim 1, wherein
   the housing switches have major surfaces that are larger in area than other surfaces of the housing switches, and
   the major surfaces of the housing switches are joined to the surface of the housing having the heat dissipator with an insulating film therebetween.

\* \* \* \* \*